United States Patent [19]
van den Berg et al.

[11] Patent Number: 5,650,721
[45] Date of Patent: Jul. 22, 1997

[54] DEVICE FOR DETECTING THE ANGULAR POSITION OF AN OBJECT USING A MAGNETORESISTIVE SENSOR

[75] Inventors: Hugo van den Berg, Herzogenaurach; Wolfgang Schelter, Uttenreuth, both of Germany

[73] Assignee: Siemens Aktiengesellschaft, Munich, Germany

[21] Appl. No.: 491,978

[22] PCT Filed: Jan. 10, 1994

[86] PCT No.: PCT/DE94/00016

§ 371 Date: Jul. 20, 1995

§ 102(e) Date: Jul. 20, 1995

[87] PCT Pub. No.: WO94/17426

PCT Pub. Date: Aug. 4, 1994

[30] Foreign Application Priority Data

Jan. 22, 1993 [DE] Germany ............ 43 01 704.5

[51] Int. Cl.⁶ .............. G01B 7/30; G01R 33/09; G01D 5/16
[52] U.S. Cl. .......... 324/207.21; 324/252; 338/32 R
[58] Field of Search ............. 324/207.21, 207.25, 324/252, 173, 174; 338/32 R; 360/113; 33/355 R, 363 R

[56] References Cited

U.S. PATENT DOCUMENTS

| | | | |
|---|---|---|---|
| 4,949,039 | 8/1990 | Grünberg | 324/252 |
| 5,134,533 | 7/1992 | Friedrich et al. | 360/113 |
| 5,159,513 | 10/1992 | Dieny et al. | 324/252 X |
| 5,287,238 | 2/1994 | Baumgart et al. | 324/252 X |
| 5,313,186 | 5/1994 | Schuhl et al. | 324/252 X |
| 5,462,795 | 10/1995 | Shinjo et al. | 324/252 X |

FOREIGN PATENT DOCUMENTS

| | | |
|---|---|---|
| 0346817 | 12/1989 | European Pat. Off. . |
| 0406060 | 1/1991 | European Pat. Off. . |
| 0478143 | 4/1992 | European Pat. Off. . |
| 0485129 | 5/1992 | European Pat. Off. . |
| 0498668 | 8/1992 | European Pat. Off. . |
| WO92/15102 | 9/1992 | WIPO . |

OTHER PUBLICATIONS

Patent Abstracts of Japan, vol. 6, No. 95, 3 Jun. 1982 & JP-A-57027081.

IEEE Transactions on Magnetics, vol. MAG-22, No. 5, Sep. 1986, New York, US, pp. 394-396, Nelson et al.: *Shear-Sensitive Magnetoresistive Robotic Tactile Sensor*.

Physical Review Letters, vol. 61, No. 21, 21 Nov. 1988, pp. 2472-2475, M.N. Baibich et al.: *Giant Magnetoresistance of (001)Fe/(001)Cr Magnetic Superlattices*.

Journal of Magnetism and Magnetic Materials, North Holland, vol. 113, 1992, pp. 79-82, T. Okuyama et al.: vol. 113, 1992, pp. 79-82, T. Okuyama et al.: *Magneto-transport phenomena of multilayered films with two magnetic components*.

Technische Informationen (Technical Information) TI 901228 of the firm of Philips GmbH, Hamburg, DE: Eigenschaften und Anwendungen der Magnetfeldsensoren KMZ 10 (Characteristics and usages of Magnetic Field Sensors KMZ 10).

*Primary Examiner*—Gerard R. Strecker
*Attorney, Agent, or Firm*—Kenyon & Kenyon

[57] ABSTRACT

A device for determining the angular position of an object uses an MR sensor which is set up in a magnetic field, where one magnetic field component ($\bar{H}$ or $\bar{H}_g$) and a reference axis of the MR sensor can rotate relative to one another in a plane of rotation through an angle of rotation ($\Theta$ or $\phi$) which has an unambiguous correlation to the angular position of the object; and the electric resistance of the MR sensor is an unambiguous function of this angle of rotation ($\Theta$ or $\phi$). The MR sensor is designed with a giant MR layer system that contains at least one measurement layer with magnetization ($\bar{M}_M$) that can be rotated through the magnetic field ($\bar{H}$ or $\bar{H}_g$); the giant MR layer system also contains at least one biasing layer with a constant magnetization ($\bar{M}_B$); and the resistance of the giant MR layer system is a function of the angle ($\alpha$) between these two magnetizations ($\bar{M}_m$ and $\bar{M}_B$).

26 Claims, 2 Drawing Sheets

DEVICE FOR DETECTING THE ANGULAR POSITION OF AN OBJECT USING A MAGNETORESISTIVE SENSOR

BACKGROUND OF THE INVENTION

The present invention relates generally to devices for detecting the angular position of an object, and more particularly to a device for detecting the angular position of an object relative to a preset zero position with a magnetoresistive (MR) sensor which has a constant reference axis plus contacts for supplying an electric current and is arranged in a magnetic field, where one magnetic field component (H or $H_g$) of the magnetic field and the reference axis of the MR sensor can be rotated by an angle of rotation ($\Theta$ or $\phi$) with respect to each other in a plane of rotation, where this angle of rotation has an unambiguous correlation with the angular position to be determined, and the electrical resistance of the MR sensor is an unambiguous function of this angle of rotation ($\Theta$ or $\phi$). Such a device is disclosed, for example, in the Philips Technical Information Brochure TI 901228 "Properties and Applications of KMZ 10 Magnetic Field Sensors."

In one embodiment of this known device for measuring the angular position, a magnetoresistive barber-pole sensor is set up in the field of a rotationally mounted magnet.

Magnetoresistive sensors are composed in general of a thin layer of a magnetoresistive material which is magnetized in the plane of the layer. When the magnetization of the layer is rotated with respect to the direction of a measurement current flowing in the layer by a magnetic field which is to be measured, there is a change in resistance that may amount to several percent of the normal isotropic resistance and can be detected as a measurement signal. This effect is called anisotropic magnetoresistance or the anisotropic magnetoresistive effect (AMR). The customary magnetoresistive materials are ferromagnetic transition metals such as Nickel (Ni), iron (Fe), or Cobalt (Co) and alloys made with these metals. At least one rectangular strip that is made of the ferromagnetic NiFe alloy known commercially as Permalloy and is magnetized in its longitudinal direction is provided with the magnetoresistive barber-pole sensor used in the known angle measurement device. Several thin metal strips are arranged side by side on the Permalloy strip at an angle of 45° to the longitudinal direction of the Permalloy strip. If voltage is now applied to the Permalloy strip in its longitudinal direction, an electric current is generated between the metal strips, where the direction of this current is essentially at an angle of ±45° or ±135°, depending on the polarity of the voltage, to the magnetization of the Permalloy strip. An external magnetic field that is to be measured and has a component at right angles to the magnetization then rotates the magnetization of the Permalloy strip relative to the direction of the current which remains constant. This rotation causes a change in resistance that has an approximately linear dependence on the magnetic field. The characteristic curve of the resistance of such a barber-pole sensor is unambiguous and at least approximately linear for an angle range of approximately 90°, which may be selected between about +45° to −45° or about −45° and +45° for the angle between the magnetization and the measurement current.

The magnetic field of the rotatable magnet is thus provided both as a measurement field and as a supporting field to stabilize the sensor characteristic. Rotation of the magnet through an angle to be measured creates a change in the resistance signal of the barber-pole sensor. The measurement range of this angle-measuring device is limited to a maximum of ±90° because the sensor has an unambiguous characteristic curve only in this angular range. Larger angles up to ±135° can be achieved by using the supporting field of an additional magnet. Angles of up to almost ±180 degrees are feasible by using two sensors set up at right angles to one another and analyzing their measurement signals in the individual angle quadrants. Possible applications of this known device are for gas pedal sensors and throttle valve sensors for motor vehicles, gradient sensors, and wind direction indicators.

In another embodiment of this invention intended for use as a compass, two barber-pole sensors crossed at right angles are set up to rotate in the magnetic field of a coil whose function is to reverse the magnetism of the sensors ("Technical Information Publication TI 901228" from Philips Components).

There are known multi-layered systems that have several ferromagnetic layers arranged in a stack and separated from one another by intermediate nonmagnetic metals layers, where the magnetization of each magnetic layer is in the plane of the layer. The thickness of each layer is selected so it is considerably smaller than the mean free path of the conduction electrons. When an electrical current is applied in such a layer system, the so-called magnetoresistive effect of giant magnetic resistance (giant MR) also occurs in the individual layers in addition to the anisotropic magnetoresistive effect. This giant MR effect is due to the varying intensity, as a function of the given magnetization, of the scattering of the majority and minority conduction electrons in the volume of the layers, especially in alloys, but also at the interfaces between the ferromagnetic layers and the intermediate layers. This giant MR is an isotropic effect—in other words, it is not dependent on the direction of the current in particular, and it can be considerably greater than the anisotropic MR, with values of up to 70% of the normal isotropic resistance.

Two basic types of such giant MR multi-layered systems are known. In the first type, the ferromagnetic layers are linked together antiferromagnetically across the intermediate layers, so the magnetizations in the planes of two neighboring ferromagnetic layers are aligned antiparallel to each other without any external magnetic field. One example of this type would be the iron-chromium superlattices (Fe-Cr superlattices) with ferromagnetic layers of Fe and antiferromagnetic intermediate layers of Cr. With a properly aligned external magnetic field, the magnetization of the neighboring ferromagnetic layers is rotated against the antiferromagnetic coupling forces and is aligned in parallel. This reorientation of the magnetization by the magnetic field results in a steady decrease in the giant MR, which is a measure of the size of the magnetic field. At saturation field strength $H_s$ there is no further change in the giant MR because all the magnetizations are then aligned parallel to one another ("Physical Review Letters," vol. 61, no. 21, Nov. 21, 1988, pp. 2472–2475).

In the second type of giant MR multi-layered system, the ferromagnetic layers are separated from one another by intermediate diamagnetic or paramagnetic layers made of metal. The thickness of the intermediate layers is adjusted so the magnetic exchange coupling between the magnetizations of the ferromagnetic layers is as small as possible. The neighboring ferromagnetic fields have different coercive field strengths.

Using an exchange-decoupled giant MR layer system of this type with magnetically softer measurement layers made of $Ni_{80}Fe_{20}$ and magnetically harder biasing layers made of Co separated from the measurement layers by intermediate layers of Cu, the resistance has already been measured as a function of the angle Θ between a saturation magnetic field strength $H_0$ and a magnetic field $H_r$ rotating parallel to the planes of the layers. The size of the rotating field $H_r$ was in this case selected such that only the magnetization $M_1$ of the measurement layers would follow the rotation of the magnetic field $H_r$, and the magnetization $M_2$ of the biasing layers would persist in the original alignment, which is determined by the saturation field $H_0$. It was found that the total electrical resistance R of the layer system as a function of the angle Θ can be represented in good approximation by the sum of a component $A_1 \cdot \cos(Θ)$ for the giant MR, a component $A_2 \cdot \cos(2 \cdot Θ)$ for the AMR, and a constant resistive component $R_0$, where the coefficient $A_2$ of the AMR component is positive and the coefficient $A_1$ of the giant MR component is negative and is about 60 times larger than $A_2$ ("Journal of Magnetism and Magnetic Materials" (North-Holland), vol. 113, 1992, pp. 79–82).

The present invention is directed to the problem of developing a device for measuring the angular position of an object as described in the introduction so that an angular measurement of at least 180° is achieved, along with greater sensitivity and a larger field range.

SUMMARY OF THE INVENTION

The present invention solves this problem by providing that the MR sensor includes a system of layers stacked one on top of the other with the planes of the layers at least approximately parallel to the plane of rotation, and this layer system also has at least one measurement layer with a magnetization ($\overline{M}_M$) that can be rotated in the plane of the layer through the magnetic field ($\overline{H}$ or $\overline{H}_g$), and at least one biasing layer with a magnetization ($\overline{M}_B$) in the plane of the layer that is mostly independent of the magnetic field ($\overline{H}$ or $\overline{H}_g$), and has an electric resistance that is a function of the angle (α) between the magnetization ($\overline{M}_M$) of the measurement layer and the magnetization ($\overline{M}_B$) of biasing layer.

By using a giant MR sensor, it is possible to at least double the measurement range because in contrast with the cos (2·Θ) dependence of the AMR, the giant MR has a cos(Θ) dependence on the angle of rotation Θ between a magnetic field $\overline{H}$ rotating in the plane of the layer and an initial magnetic field $\overline{H}_0$. In addition, the sensitivity can be increased by a factor of almost ten, and larger magnetic fields can be used.

In one embodiment according to the present invention, a change in angular position is converted to a rotation of a magnetic field H, whereas in another embodiment of the present invention, the change in angular position is converted to a corresponding rotation of the magnetoresistive sensor with respect to an external magnetic field $\overline{H}_g$ that is at least approximately constant. The first embodiment is suitable for automotive gas pedal sensors or throttle valve sensors, for example, where angles of about 140° occur, and this embodiment is preferably used for a noncontacting potentiometer. The second embodiment is preferably used as a compass.

BRIEF DESCRIPTION OF THE INVENTION

DETAILED DESCRIPTION

Parts which correspond to one another in these FIGS. are denoted by the same reference numbers.

Figure 1:
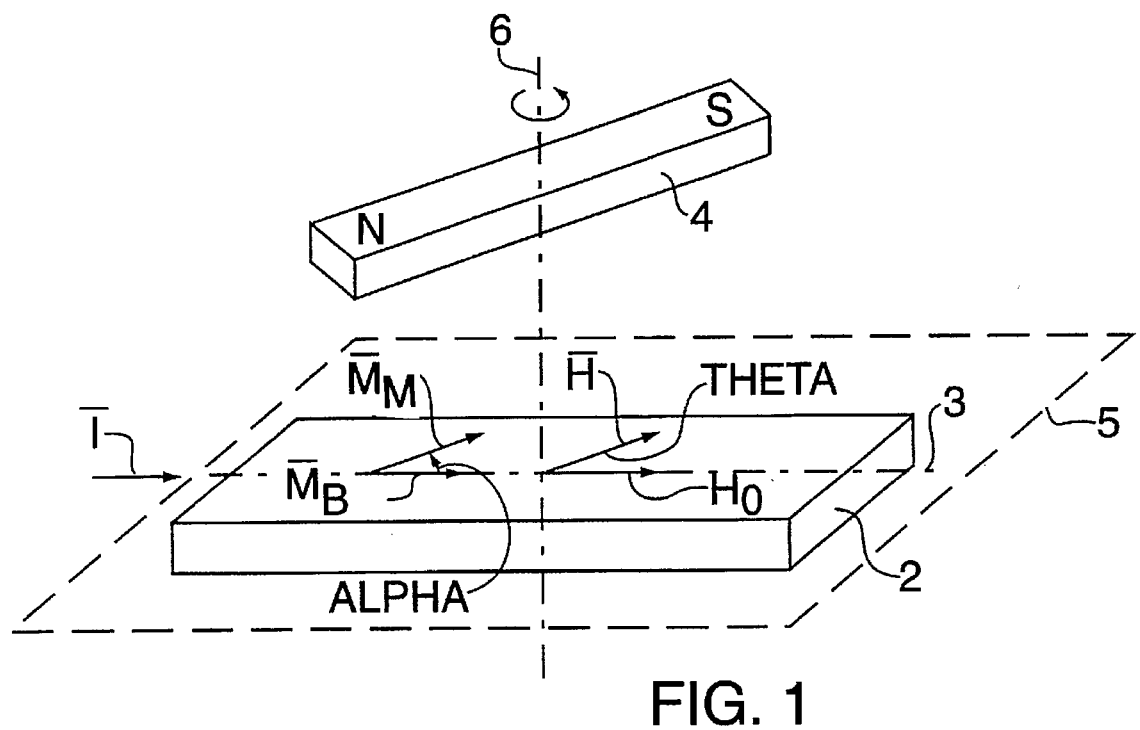
FIG. 1 shows a schematic diagram of a device for measuring an angular position with a rotating magnet.

In the embodiment according to FIG. 1, an MR sensor 2 is provided with a giant MR layer system that is not shown in detail but is positioned in the magnetic field of a magnet 4 that rotates around an axis of rotation 6. Magnet 4 thus generates a magnetic field with a component $\overline{H}$ in a plane of rotation 5 normal to axis of rotation 6. This plane of rotation 5 is aligned parallel to the planes of the individual layers of the giant MR layer system. MR sensor 2 has a reference axis 3 in plane of rotation 5, and an electric current $\overline{I}$ passes through it during the measurement, preferably parallel to reference axis 3 and to the planes of the layers, but the current may also run in a direction normal to the planes of the layers and to reference axis 3. The layer system contains at least one measurement layer with a magnetization $\overline{M}_M$ that can be rotated through the magnetic field $\overline{H}$ and at least one biasing layer with a magnetization $\overline{M}_B$ that is at least approximately fixed (nonrotating) with respect to reference axis 3. MR sensor 2 with the layer system is designed as an elongated strip whose longitudinal direction corresponds to reference axis 3. The magnetization $\overline{M}_B$ of the biasing layer is also parallel to the longitudinal direction of MR sensor 2. The demagnetizing fields can thus be attenuated.

In an especially advantageous embodiment of this invention that is not illustrated in a diagram, MR sensor 2 and the layers of its giant MR layer system are designed to be at least approximately circular in order to reduce problematical edge effects due to demagnetizing fields.

If the magnetic field $\overline{H}$ of magnet 4 in its starting position (denoted as initial magnetic field $\overline{H}_0$) is parallel to reference axis 3 of MR sensor 2, then the magnetizations $\overline{M}_M$ of the measurement layer and $\overline{M}_B$ of the biasing layer are aligned parallel to one another and the angle α between them is 0°. Of course, the angle α can also be 180° if the magnetization $\overline{M}_B$ is antiparallel to the initial magnetic field $\overline{H}_0$. If magnet 4 is rotated around the axis of rotation 6, magnetic field $\overline{H}$ rotates in plane of rotation 5 through a corresponding angle Θ with respect to the initial magnetic field $\overline{H}_0$.

The magnetization $\overline{M}_M$ of the measurement layer is also rotated at the same time, resulting in a new angle a between the rotated magnetism $\overline{M}_M$ of the measurement layer and the fixed magnetism $\overline{M}_B$ of the biasing layer. This angle α is in general approximately equal to the angle of rotation Θ or 180°+Θ. The electric resistance R of the giant MR layer system through which the current $\overline{I}$ is flowing is an unambiguous function of the angle α between the two magnetizations $\overline{M}_M$ and $\overline{M}_B$ in an angle of 180°, and in fact the maximum resistance R is found at α=180° and the minimum is found at α=0°.

With this device, the angular position of a body in a plane parallel to the plane of rotation 5 can be measured by converting the change in angular position into a rotation of magnet 4 about axis of rotation 6 by means of a shaft and then measuring the resistance R of MR sensor 2.

In an especially advantageous embodiment of the invention, the device is used for a noncontacting potentiometer.

Using a rotating device such as an adjusting knob, magnet 4 and its magnetic field $\overline{H}$ are rotated by means of a shaft and the resistance R of the layer system changes accordingly. Such a potentiometer has the advantage that its electrically contacted part is not mechanically coupled to the rotating part. Therefore, additional partitions can be provided between these two parts—namely, magnet 4 with the shaft and rotating device on the one hand, and the layer system with its corresponding electric contacts on the other hand—as long as these partitions do not reduce the stray field of magnet 4 too much. Furthermore, this potentiometer does not need a sliding contact, which would be subject to wear and corrosion.

Another advantageous application of the device according to this invention is for measuring and regulating the speed of electric motors. In this case, the axis of rotation 6 is preferably arranged parallel to the carrying axle of the electric motor. Devices for measuring speed by measuring the angular position of the motor axle at regular time intervals have now been provided. In comparison with known inductive pickups, this rotational speed measuring device has the advantage that even low speeds can be determined, and the signal does not depend on the speed.

Using a setup with two MR sensors whose reference axes are placed at right angles to each other, both the resting and moving angular positions of the motor axle can be determined by squaring the measurement signals of the two MR sensors.

Figure 2:
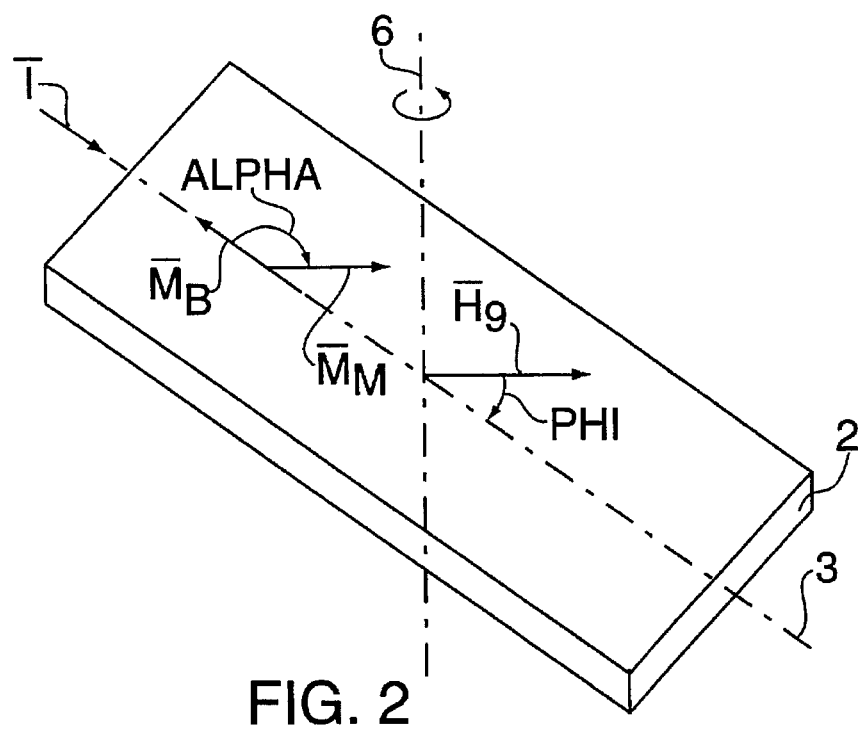
FIG. 2 shows a schematic diagram of a device for measuring an angular position with a giant MR sensor.

FIG. 2 shows an embodiment of this invention with an MR sensor that can rotate about axis of rotation 6 and is placed in a spatially fixed magnetic field $\overline{H}_g$. This device is especially suitable for use as a compass, with the earth's magnetic field serving as magnetic field $\overline{H}_g$. Rotation of reference axis 3 of MR sensor 2 through angle of rotation $\phi$ from an initial position parallel to the magnetic field $\overline{H}_g$ again leads to a corresponding rotation of the magnetization $\overline{M}_M$ of the measurement layer. An angle $\alpha$ is formed between the magnetizations $\overline{M}_M$ and $\overline{M}_B$ of the measurement layer and the biasing layer, respectively, and the resistance signal of the MR sensor 2 varies as a function of this angle $\alpha$.

Figure 3:
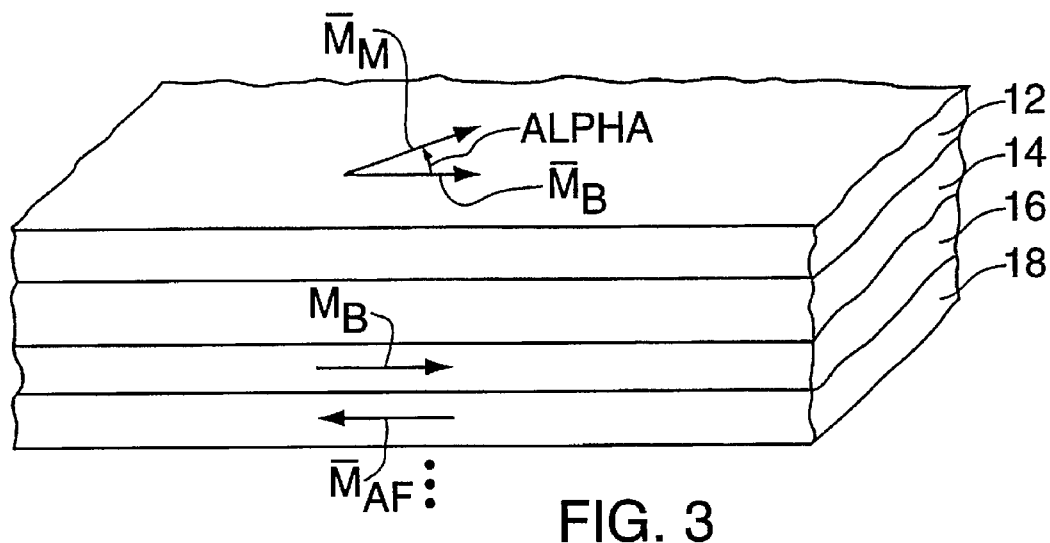
FIGS. 3 and 4 show schematic diagrams of a giant MR layer system for a device according to the invention.
Figure 4:
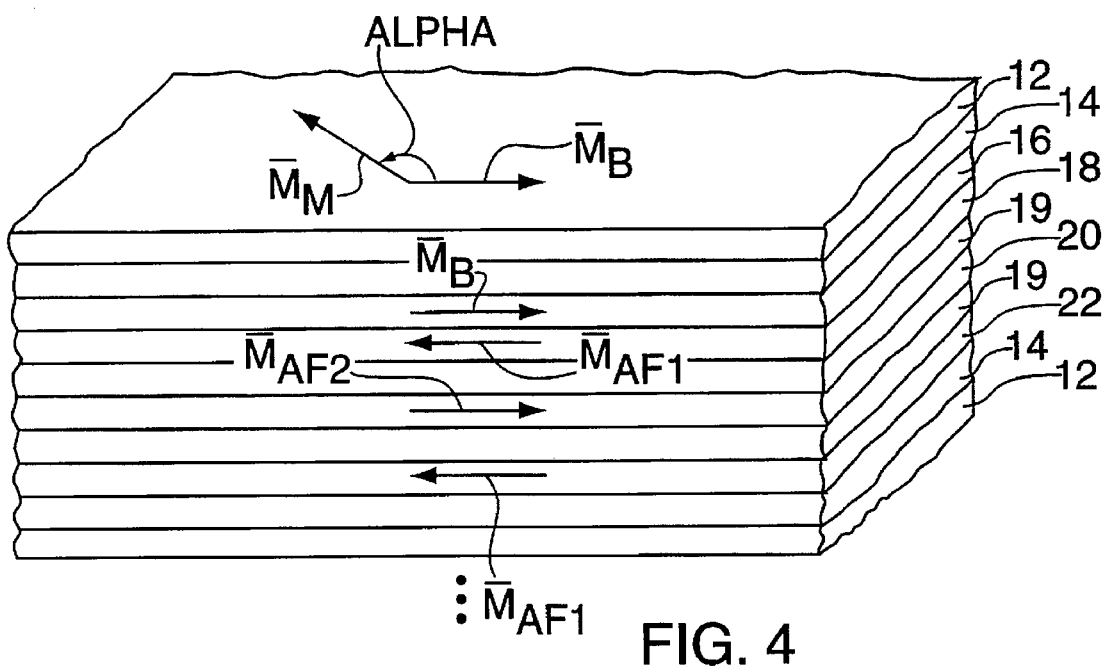

FIGS. 3 and 4 illustrate embodiments of giant MR layer systems according to this invention.

FIG. 3 illustrates one embodiment of this invention with a measurement layer 12 with a magnetization $\overline{M}_M$ in the plane of its layer and a biasing layer 16 with a fixed magnetization $\overline{M}_B$ in its plane. Measurement layer 12 and biasing layer 16 are magnetically exchange-decoupled to a great extent by means of an electrically conducting, non-magnetic intermediate layer 14. An angle $\alpha$ results between the two magnetizations $\overline{M}_M$ and $\overline{M}_B$, and corresponds to the position of the magnetic field $\overline{H}$ (not shown in the FIG). In this embodiment of the invention, the magnetization $\overline{M}_B$ of biasing layer 16 is stabilized by an additional magnetic layer 18 with a magnetization $\overline{M}_{AF}$ that is antiparallel to the magnetization $\overline{M}_B$. This additional magnetic layer 18 is antiferromagnetically coupled to biasing layer 16 on the side facing away from measurement layer 12.

In another embodiment of this invention (not shown in the FIGS.), biasing layer 16 is provided with a preferred axis and is magnetized in parallel to this preferred axis.

In another embodiment of this invention as illustrated in FIG. 4, an antiferromagnetic layer system is antiferromagnetically coupled to biasing layer 16. This antiferromagnetic layer system consists of two magnetic layers 18 and 22 whose magnetizations $\overline{MAF1}$ are in the same direction in the planes of the layers and a third magnetic layer 20 with magnetization $\overline{M}_{AF2}$ antiparallel to $\overline{MAF1}$, where each layer is antiferromagnetically coupled by means of intermediate layer 19 to magnetic layers 18 and 22. With this arrangement of the layers, the direction of magnetization $\overline{M}_B$ of biasing layer 16 can also be kept constant.

The antiferromagnetic layer system can also be constructed from only two antiferromagnetically coupled magnetic layers.

Intermediate layers are preferably provided between the magnetic layers of the antiferromagnetic layer system. In the embodiment of this invention illustrated in FIG. 3, an intermediate layer can also be placed between biasing layer 16 and the antiferromagnetically coupled antiferromagnetic layer system or individual layer.

In a special embodiment of this invention, measurement layer 14 and biasing layer 16 are antiferromagnetically or ferromagnetically exchange-coupled to each other, preferably by means of an intermediate layer, so their magnetizations $\overline{M}_M$ and $\overline{M}_B$ without the magnetic field $\overline{H}$ are aligned antiparallel or parallel to each other.

Preferably, several of the layer systems previously described with one measurement layer 12 and one biasing layer 16 are assembled in a stack, preferably a periodic arrangement. Typically, up to 100 such layer systems will be stacked one on top of the other.

For measurement purposes, the entire giant MR layer system is provided with at least two contacts. These contacts are either both placed on the top layer, so that on the whole the current $\overline{I}$ flows parallel to the layer planes (current-in-plane=cip); or as an alternative, one contact is placed on the top layer and one is placed on the bottom layer, so the current $\overline{I}$ flows mostly at right angles to the layer planes (current-perpendicular-to-planes=cpp).

What is claimed is:

1. In a device for detecting an angular position of an object relative to a preset zero position using a magnetoresistive (MR) sensor which has a constant reference axis plus contacts for supplying an electric current and is arranged in a magnetic field, where one magnetic field component of the magnetic field and reference axis of the MR sensor can be rotated by an angle of rotation with respect to each other in a plane of rotation, where the angle of rotation has an unambiguous correlation with the angular position to be determined, and the electrical resistance of the MR sensor is an unambiguous function of the angle of rotation, an MR sensor comprising:

a) a system of layers stacked one on top of another with a plane of each of the layers being at least approximately parallel to the plane of rotation, said layer system including:

(i) at least one measurement layer having a magnetization ($\overline{M}_M$) that can be rotated in a plane of the measurement layer through the magnetic field;

(ii) at least one biasing layer having a magnetization ($\overline{M}_B$) in a plane of the biasing layer that is mostly independent of the magnetic field, wherein the layer system has an electric resistance that is a function of an angle between the magnetization ($\overline{M}_M$) of the measurement layer and the magnetization ($\overline{M}_B$) of the at least one biasing layer; and (iii) at least one magnetic layer being disposed on a side of said at least one biasing layer that faces away from the measurement layer, the at least one magnetic layer having a magnetization ($\overline{M}_{AF}$) antiparallel to the magnetization ($\overline{M}_B$) of the at least one biasing layer and stabilizing the magnetization ($\overline{M}_B$) of the at least one biasing layer by antiferromagnetically coupling to the at least one biasing layer.

2. The MR sensor according claim 1, wherein the system of layers further comprises an intermediate layer disposed between the measurement layer and the biasing layer, whereby the measurement layer is at least approximately magnetically exchange-decoupled from the biasing layer by the intermediate layer.

3. The MR sensor according to claim 1, wherein the biasing layer has a coercive field strength that is quantitatively greater than the magnetic field, and the measurement layer has a coercive field strength that is quantitatively smaller than the magnetic field.

4. The MR sensor according to claim 1, wherein the system of layers further comprises an intermediate layer disposed between the measurement layer and the biasing layer, whereby the measurement layer and the biasing layer are exchanged-coupled by the intermediate layer.

5. The MR sensor according to claim 1, wherein said biasing layer is directly joined to the magnetic layer.

6. The MR sensor according to claim 1, wherein the system of layers further comprises an intermediate layer disposed between the biasing layer and the magnetic layer.

7. The MR sensor according to claim 1, further comprising at least one second magnetic layer coupled to the at least one magnetic layer.

8. The MR sensor according to claim 7, further comprising an intermediate layer disposed between the at least one magnetic layer and the at least one second magnetic layer.

9. The MR sensor according to claim 1, wherein all layers in the system of layers are arranged in a stack in a periodic sequence.

10. The MR sensor according to claim 1, wherein the layer system is at least approximately circular in shape.

11. A device for detecting an angular position of an object relative to a preset zero position, comprising a magnetoresistive (MR) sensor having:
   a) a constant reference axis;
   b) a plurality of contacts for supplying an electric current, wherein the MR sensor is disposed in a magnetic field, one magnetic field component of the magnetic field and the reference axis of the MR sensor can be rotated by an angle of rotation with respect to each other in a plane of rotation, the angle of rotation has an unambiguous correlation with the angular position to be determined, and an electrical resistance of the MR sensor is an unambiguous function of the angle of rotation;
   c) a system of layers stacked one on top of another with a plane of each of the layers being at least approximately parallel to the plane of rotation, said layer system including:
      (i) at least one measurement layer having a magnetization ($\overline{M}_M$) that can be rotated in a plane of the measurement layer through the magnetic field;
      (ii) at least one biasing layer having a magnetization ($\overline{M}_B$) in a plane of the biasing layer that is mostly independent of the magnetic field, wherein the layer system has an electric resistance that is a function of an angle between the magnetization ($\overline{M}_M$) of the measurement layer and the magnetization ($\overline{M}_B$) of the at least one biasing layer; and
      (iii) at least one magnetic layer being disposed on a side of said at least one biasing layer that faces away from the measurement layer, the at least one magnetic layer having a magnetization ($\overline{M}_{AF}$) antiparallel to the magnetization ($\overline{M}_B$) of the at least one biasing layer and stabilizing the magnetization ($\overline{M}_B$) of the at least one biasing layer by antiferromagnetically coupling to the at least one biasing layer.

12. The device according to claim 11, wherein the MR sensor is disposed in a fixed location spatially and a plurality of devices are provided for generating a magnetic field that rotates with respect to the reference axis of the MR sensor in the plane of rotation.

13. The device according to claim 11, wherein the device is used as a noncontacting potentiometer.

14. The device according to claim 11; wherein the magnetic field is in a fixed location and the reference axis of the MR sensor can be rotated in the plane of rotation.

15. The device according to claim 11, wherein the system of layers further comprises an intermediate layer disposed between the measurement layer and the biasing layer, whereby the measurement layer is at least approximately magnetically exchange-decoupled from the biasing layer by the intermediate layer.

16. The device sensor according to claims 11; wherein the system of layers further comprises an intermediate layer disposed between the measurement layer and the biasing layer, whereby the measurement layer and the biasing layer are exchanged-coupled by the intermediate layer.

17. The device according to claim 11, wherein the biasing layer has a preferred magnetic axis and is magnetized along the preferred axis.

18. The device according to claim 11, wherein said biasing layer is directly joined to the magnetic layer.

19. The device 1according to claim 11, wherein the system of layers further comprises an intermediate layer disposed between the biasing layer and the magnetic layer.

20. The system according to claim 11, further comprising at least one second magnetic layer coupled to the at least one magnetic layer.

21. The system according to claim 20, further comprising an intermediate layer disposed between the at least one magnetic layer and the at least one second magnetic layer.

22. The device according to claim 20, further comprising a plurality of intermediate layers at least partially provided between the magnetic layers.

23. The device according to claim 11, wherein the layers in the system of layers are arranged in a stack in a periodic sequence.

24. The device according to claim 11, wherein the layer system is at least approximately circular in shape.

25. The device according to claim 11, further comprising an additional MR sensor having its reference axis aligned normal to the reference axis of the other MR sensor.

26. An apparatus for detecting rotational motion of an object by detecting an angular position of the object relative to a preset zero position at regular intervals, including a plurality of devices, each device comprising a magnetoresistive (MR) sensor having:
   a) a constant reference axis;
   b) a plurality of contacts for supplying an electric current, wherein the MR sensor is disposed in a magnetic field, one magnetic field component of the magnetic field and the reference axis of the MR sensor can be rotated by an angle of rotation with respect to each other in a plane of rotation, the angle of rotation has an unambiguous correlation with the angular position to be determined, and an electrical resistance of the MR sensor is an unambiguous function of the angle of rotation;
   c) a system of layers stacked one on top of another with a plane of each of the layers being at least approximately parallel to the plane of rotation, said layer system including:
      (i) at least one measurement layer having a magnetization ($\overline{M}_M$) that can be rotated in a plane of the measurement layer through the magnetic field;
      (ii) at least one biasing layer having a magnetization ($\overline{M}_B$) in a plane of the biasing layer that is mostly independent of the magnetic field, wherein the layer system has an electric resistance that is a function of an angle between the magnetization ($\overline{M}_M$) of the measurement layer and the magnetization ($\overline{M}_B$) of the at least one biasing layer; and
      (iii) at least one magnetic layer being disposed on a side of said at least one biasing layer that faces away from the measurement layer, the at least one magnetic layer having a magnetization ($\overline{M}_{AF}$) antiparallel to the magnetization ($\overline{M}_B$) of the at least one biasing layer and stabilizing the magnetization ($\overline{M}_B$) of the at least one biasing layer by antiferromagnetically coupling to the at least one biasing layer.

* * * * *